(12) United States Patent
Tekin

(10) Patent No.: US 7,864,870 B2
(45) Date of Patent: Jan. 4, 2011

(54) ULTRA WIDEBAND WAVEFORM GENERATOR CIRCUIT

(75) Inventor: Ibrahim Tekin, Istanbul (TR)

(73) Assignee: Sabanci Universitesi, Istanbul (TR)

( * ) Notice: Subject to any disclaimer, the term of this patent is extended or adjusted under 35 U.S.C. 154(b) by 1040 days.

(21) Appl. No.: 11/452,598

(22) Filed: Jun. 14, 2006

(65) Prior Publication Data

US 2007/0002930 A1 Jan. 4, 2007

(30) Foreign Application Priority Data

Jun. 30, 2005 (EP) .................................. 05404001

(51) Int. Cl.
*H04B 3/00* (2006.01)
(52) U.S. Cl. ...................................... 375/257; 324/639
(58) Field of Classification Search ................. 375/130, 375/256–258, 315, 295; 324/639
See application file for complete search history.

(56) References Cited

U.S. PATENT DOCUMENTS

| 5,345,471 | A * | 9/1994 | McEwan ..................... 375/130 |
| 5,942,950 | A * | 8/1999 | Merenda ....................... 331/99 |
| 6,239,671 | B1 * | 5/2001 | Smith ......................... 333/35 |
| 6,449,308 | B1 * | 9/2002 | Knight et al. ................ 375/212 |
| 6,956,653 | B1 * | 10/2005 | Lam et al. .................... 356/477 |
| 2004/0000965 | A1 * | 1/2004 | Usami et al. ................. 333/116 |
| 2005/0105637 | A1 * | 5/2005 | Fitzpatrick et al. .......... 375/295 |
| 2006/0125609 | A1 * | 6/2006 | Kline et al. ............. 340/310.17 |
| 2006/0152404 | A1 * | 7/2006 | Fullerton et al. ............... 342/28 |
| 2007/0035380 | A1 * | 2/2007 | Overhultz et al. ............ 340/5.9 |
| 2007/0132489 | A1 * | 6/2007 | Corum ....................... 327/116 |
| 2007/0273390 | A1 * | 11/2007 | Champion et al. .......... 324/639 |
| 2009/0111407 | A1 * | 4/2009 | Nail et al. ................. 455/168.1 |

OTHER PUBLICATIONS

Lee J S et al: "New Uniplanar Subnanosecond . . . Applications": IEEE Transactions on Microwave Theory and Techniques, IEEE Service Center, Piscataway, NJ, US: vol. 49: No. 6: Part 1: Jun. 2001: pp. 1126-1129: XP001097032: ISSN: 0018-9480: p. 1126: Paragraph I:—p. 1127: Paragraph III.
Low Z N et al: "Novel Low Cost . . . Circuit": Communications Systems, 2004. ICCS 2004. The Ninth International Conference on Singapore, China: Sep. 6-8, 2004: Piscataway, NJ, USA: IEEE, Sep. 6, 2004: pp. 30-344: XP010743277: ISBN: 0-7803-8549-7: p. 30: Paragraph 2—p. 33: Paragraph 4.

* cited by examiner

*Primary Examiner*—Emmanuel Bayard
(74) *Attorney, Agent, or Firm*—Ladas & Parry

(57) ABSTRACT

The invention relates to a novel ultra wideband (UWB) waveform generator circuit (1) placed on a substrate, with transmission lines, loads and ports; wherein the circuit takes as input a waveform and generates as output the derivative of said waveform, characterised in that it has two microstrip transmission lines (2,3) and that these lines (2,3) are coupled.

20 Claims, 8 Drawing Sheets (a) even mode (b) odd mode (a) even mode (b) odd mode

ULTRA WIDEBAND WAVEFORM GENERATOR CIRCUIT

The present invention relates to a novel ultra wideband (UWB) waveform generator circuit.

BACKGROUND ART

UWB signal is defined as the signal that has the bandwidth to center frequency ratio greater than 0.25 or bandwith of 500 MHz or greater. In the past, UWB technology has found military applications in ground penetrating radars (GPR), wall penetrating radars, secure communications and precision positioning/trackings. However, nowadays there is also a growing interest in commercial use of UWB technology such as in Wireless Personal Area Networks (WPAN). FCC recently allocated the frequency range from 3.1 to 10.6 GHz for UWB communications.

This interest has been the result of increasing demand for much higher data rates on the order of hundreds of megabits, since future wireless networks requires very large transmission bandwidths to reach these data rates. Currently, most wireless data technologies such as Bluetooth, IEEE 802.11b have baseband signals up to tens of megabits, and the baseband signal is sent using an RF carrier, which is basically a narrowband communication technique.

There are mainly two alternative ways of UWB systems from the point of view of generating the UWB signal. One system is the so called the impulse radio, in which ultra narrow pulses with durations of picoseconds are generated and the generated time pulses may span a few GHz wide bandwidth. The other system is the multibanded approach so that multiple narrowband signals are generated independently and then combined to form the larger bandwidth of UWB signal.

For time domain impulses, there exist different waveforms that can be used for UWB signal such as Gaussian monopulse, Gaussian doublets, Rayleigh, Laplacian, wavelet monopulses, etc. Each of these waveforms can be designed for a specific center frequency and a required bandwidth. The frequency domain parameters of the pulses can be derived by the time domain parameters of the pulses, and vice versa.

Specifically, time duration of the pulse determines the frequency bandwidth occupied by the signal, the cycles per pulse. In other words, number of zero crossings determines the center frequency of the pulse and the pulse shape will provide the sidelobe levels of the signal as well as how the signal energy is distributed over the range of frequency bandwidth.

FIG. 1 shows the time domain waveform of an UWB monopulse for a duration of 400 picoseconds. This ideal Gaussian doublet is obtained as a derivative of a Gaussian waveform which is given by the following formula:

$$V(t) = \frac{t}{\tau} e^{-(\frac{t}{\tau})^2} \quad (I)$$

where τ (tau) is the time duration of the pulse chosen as τ=100 psec.

FIG. 2 shows the plot of the Gaussion monopulse waveform in frequency domain, wherein the center frequency of the Gaussion monopulse $f_c$ can be estimated as 2.7 GHz, which is determined by the number of zero crossings in total duration of the monopulse, τ. The 3-dB bandwidth is about 2.5 GHz, which is given as the inverse of the total duration of the pulse 1/τ. The envelope of the monopulse will determine how the total power of the monopulse will be distributed over the ultra wideband frequency bandwidth of the monopulse.

The UWB pulse is centered around a center frequency with an ultra wide bandwidth. In other words, the single pulse may have a very large bandwidth. However, if it is centered around the zero-frequency, the design of one compact antenna for all frequencies would be very difficult. This is due to the fact that for an efficient radiator at low frequencies, antenna size should be comparable to the wavelength, which is enormously large at low frequencies.

One way to obtain such kind of a pulse and eliminate the antenna size problem, is to first generate the zero-frequency centered pulse, then take the derivative of the pulse to eliminate the constant or DC part of the pulse and shift the center frequency from zero to a higher frequency $f_c$.

Various designs of ultra wideband waveform generators are known in the art.

An example of such UWB waveform generator circuits is disclosed in BUCHEGGER, Thomas et al. "A Novel low-cost ultra wideband microstrip pulse forming network for gaussian monocycle generation." 2003 *International Workshop on Ultra Wideband Systems* (*IWUWBS*). In this pulse forming network, microstrip lines with a short circuit termination was used to obtain the gaussian monocycle. However, with this approach there is a large ringing at the output.

Another example of such UWB waveform generator circuits is disclosed in HAN, Jeongwoo, et al. "A New ultra-wideband, ultra-short monocycle pulse generator with reduced ringing." *IEEE Microwave and Wireless Component Letters*. June 2002, vol. 12, no. 6, p. 206-208. Han et. al use Step Recovery diode and short circuited transmission line to obtain the pulse and a simple RC filter to take the derivative. However, with this approach the pulse envelope properties are degraded which results in shape distortion in frequency domain and the amplitude of the pulse is lower due to the resistance loss.

Thus, there is a need for an UWB waveform generator circuit that can produce smooth and well-shaped pulses and achieve minimum losses in the resultant amplitude of the pulse and especially produce very small second order reflections also known as ringing. This is very important if the UWB waveform generator circuit is to be used in a receiver for determining a radar return typically a small amplitude signal.

SUMMARY OF THE INVENTION

The invention has been proposed in view of the related art problems and aims at providing an UWB waveform generator circuit placed on a substrate with transmission lines, loads and ports; the circuit takes as input a waveform and generates as output the derivative of said waveform; the improvement being that the circuit has two microstrip transmission lines and that these lines are coupled.

The loads match with the characteristic impedances of the microstrip transmission lines. These matched loads terminate the corresponding ports.

UWB waveform generator circuit according to the present invention generates the derivative of the waveform using the even and odd mode propagations on the microstrip transmission lines. The length of the microstrip transmission lines can be set according to the desired pulse width of the waveform.

The UWB waveform generator circuit according to the present invention can be used in applications chosen from: UWB communication transmitter and receiver circuits, wireless personal area networks (WPAN), radars, preferably ground penetrating radars, Thru-wall imaging radars.

BRIEF DESCRIPTION OF THE DRAWINGS

A microstrip coupled line, UWB waveform generator circuit in accordance with the present invention will now be described, by way of example only, with reference to the accompanying drawings in which.

DETAILED DESCRIPTION

Figure 3:
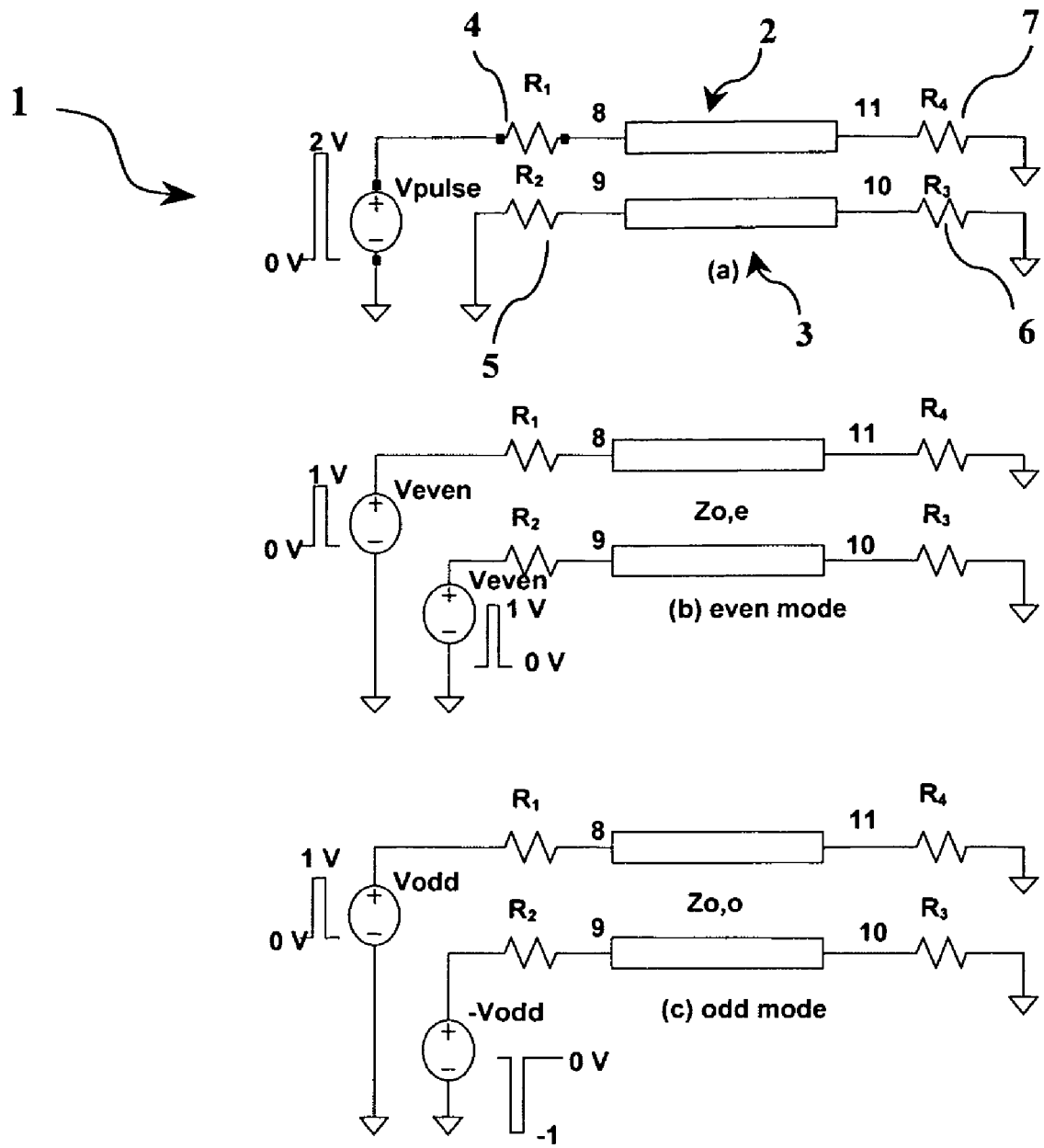
FIG. 3a shows a microstrip coupled line, UWB waveform generator circuit according to the present invention.
FIGS. 3b and 3c show a microstrip coupled line UWB waveform generator circuit according to the present invention for even and odd modes respectively.

FIG. 3a shows an UWB waveform generator circuit (1), with transmission lines (2,3), loads $R_1$(4), $R_2$(5), $R_3$(6) and $R_4$(7) and ports (8, 9, 10, 11). Said circuit (1) takes as input a waveform and generates as output the derivative of said waveform. The circuit (1) has two microstrip transmission lines (2,3) and these lines (2,3) are coupled.

For the microstrip implementation of the circuit (1), the microstrip transmission lines (2,3) are placed on a substrate. The length of the microstrip transmission lines (2,3) can be set according to the desired pulse width of the waveform.

The loads $R_1$(4), $R_2$(5), $R_3$(6) and $R_4$(7) match with the characteristic impedances of the microstrip transmission lines (2,3). These matched loads $R_1$(4), $R_2$(5), $R_3$(6) and $R_4$(7) terminate the corresponding ports (8, 9, 10, 11).

The input is applied from port1 (8) and depending of the length of the microstrip coupled transmission lines (2, 3), the output is either from port 3 (10) or port4 (11). The circuit (1) is formed by a finite length of the coupled transmission lines (2, 3) and generates the derivative of the waveform from the even and odd mode propagations on the microstrip transmission lines (2,3).

The analysis of the UWB waveform generator circuit (1) can be obtained using even, odd mode analysis. Since there are 3 conducting parts in the coupled microstrip line (2 microstrip conductors and a ground plane), even mode propagates between the conductors and the ground plane, and the odd mode propagates between two strip conductors.

The circuits in FIG. 3b and 3c show the even and odd mode propagation circuits. After solving for even and odd mode circuits, the total solution can be written as the sum of these solutions. It can be noticed from FIG. 3b and 3c that for the even mode, the polarity of the applied voltages at port1 (8) and port2 (9) are the same, whereas, for the odd mode analysis, the polarities are reversed for port1 (8) and port2 (9).

Figure 1:
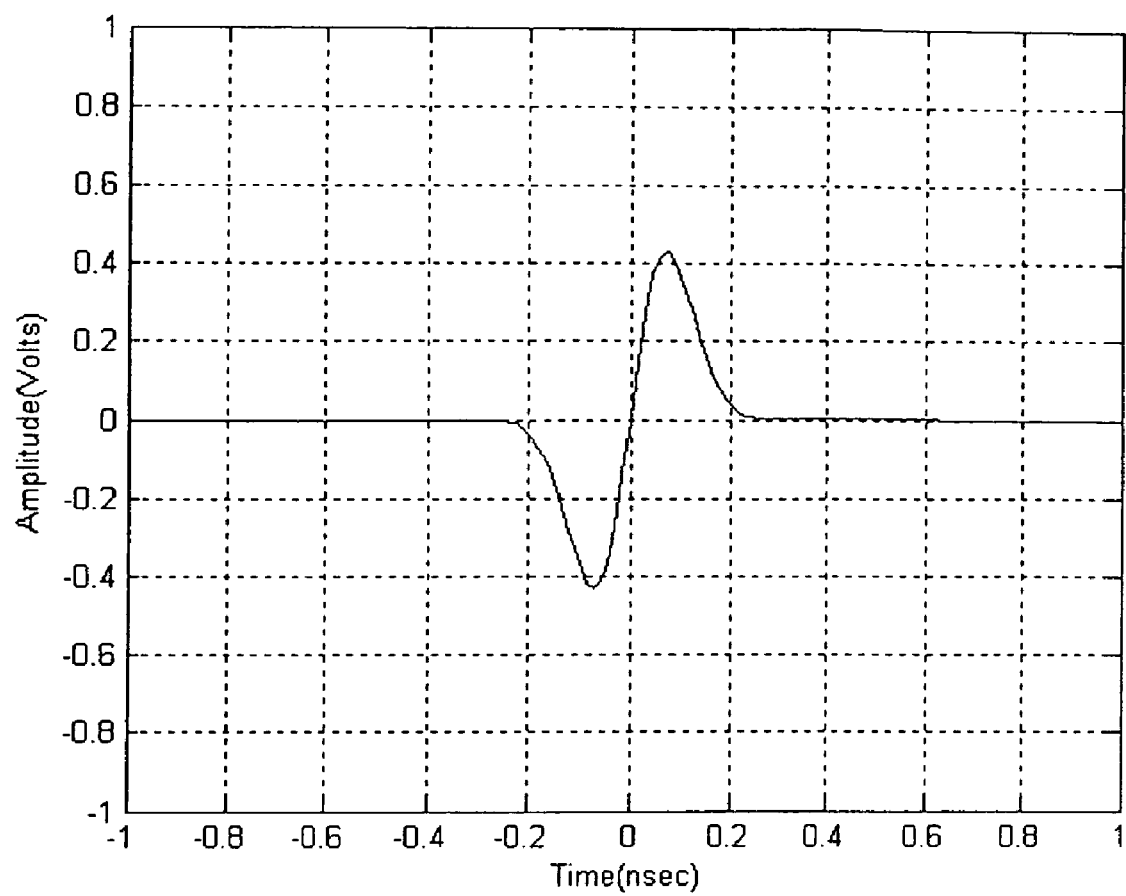
FIG. 1 shows the time domain waveform of a UWB monopulse for a duration of 400 picoseconds.
Figure 2:
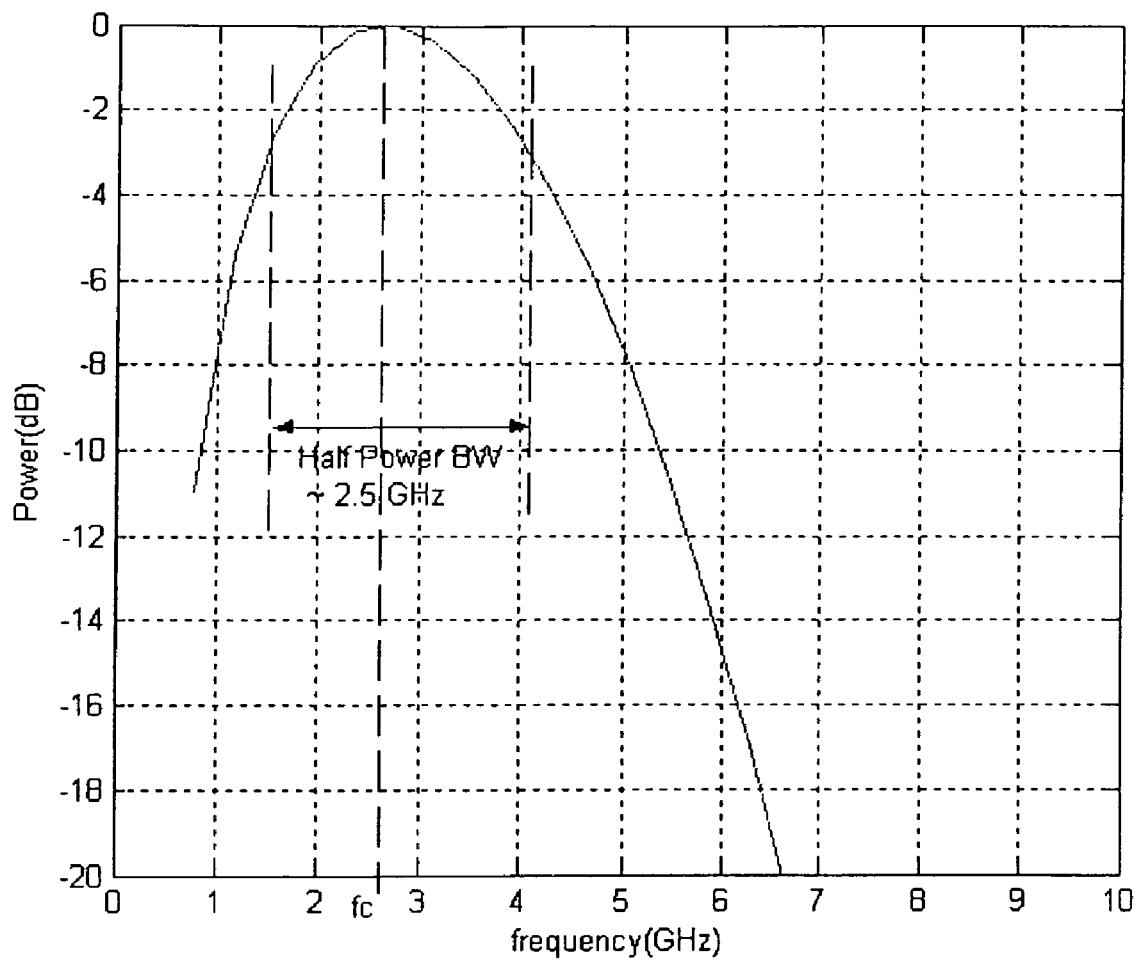
FIG. 2 shows the plot of the Gaussian monopulse waveform in frequency domain.

When even and odd mode voltages are added in FIG. 3b and 3c, 2 volts is obtained for port1 and 0 volts is obtained for port2, which are the voltages in FIG. 3a. It is also noted that the propagation constants, $\beta_{0,o}$ and $\beta_{0,e}$, the characteristic impedances, $Z_{0,o}$ and $Z_{0,e}$ are different for even and odd modes. The total voltages at ports are given as $$V_1 = V_{1,e} + V_{1,o} \quad (1)$$

$$V_2 = V_{2,e} + V_{2,o} \quad (2)$$

$$V_3 = V_{3,e} + V_{3,o} \quad (3)$$

$$V_4 = V_{4,e} + V_{4,o} \quad (4)$$

where $V_{i,e}$ and $V_{i,o}$ are the even and odd mode voltages for port i. The Microstrip coupled line (MCL) circuit according to the invention can be further simplified by using the symmetry of the circuits as follows;

$$V_{1,e} = V_{2,e} \quad (5)$$

$$V_{3,e} = V_{4,e} \quad (6)$$

$$V_{1,o} = -V_{2,o} \quad (7)$$

$$V_{3,o} = -V_{4,o} \quad (8)$$

Figure 4:
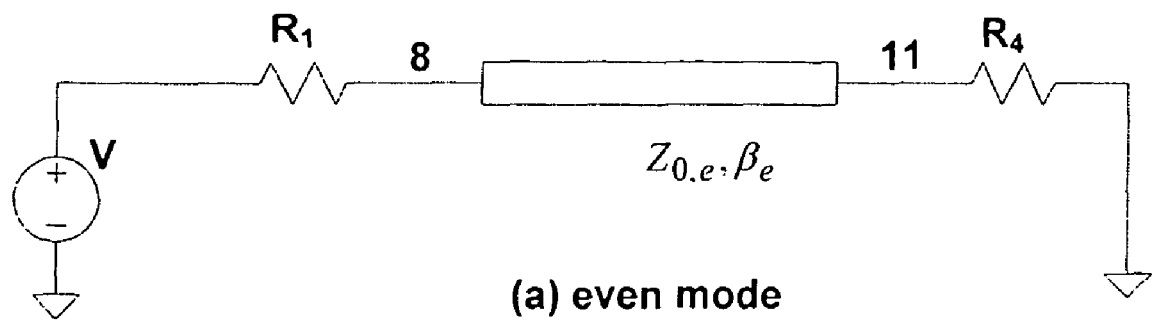
FIG. 4 shows a microstrip transmission line circuit according to the present invention for even and odd modes.
Figure 4:
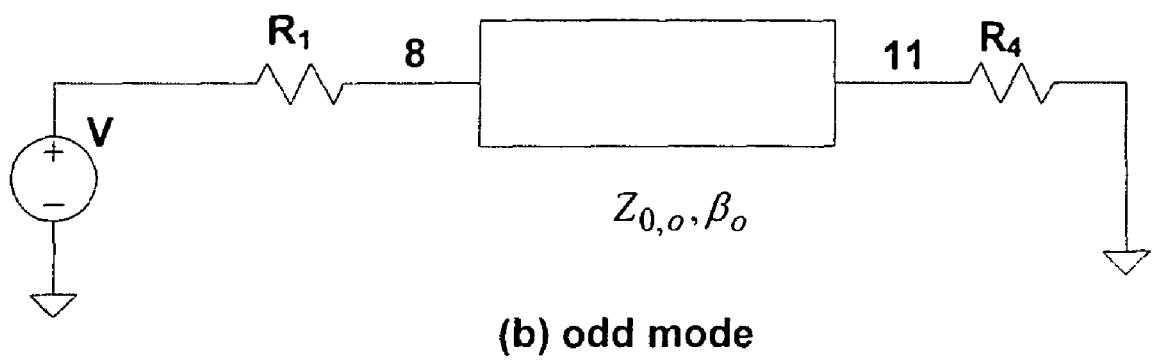

FIG. 4 shows a microstrip transmission line circuit for even and odd modes. The simplified circuit is only a transmission line circuit with a load for both even and odd modes, with different transmission line characteristic impedances and propagation constants. Now, the voltages can be rewritten in terms of only $V_{1,e}$, $V_{1,o}$ and $V_{4,e}$, $V_{4,o}$ and substituting Equations (5)-(8) in Equations (3) and (4), the modified equations for $V_2$ and $V_3$ are as follows;

$$V_2 = V_{1,e} - V_{1,o} \quad (9)$$

$$V_3 = V_{4,e} - V_{4,o} \quad (10)$$

The equations for characteristic impedances and the propagation constants for even and odd modes are given by $$Z_{0,e} = R_0 \sqrt{\frac{1+C}{1-C}} \quad (11)$$

$$Z_{0,o} = R_0 \sqrt{\frac{1-C}{1+C}} \quad (12)$$

where $R_0$ is the characteristic impedance of the uncoupled microstrip line and C is the coupling coefficient. Note that the geometric mean of $Z_{0,e}$ and $Z_{0,o}$ is $R_0$ and for positive values of C, the even mode characteristic impedance $Z_{0,e}$ is greater than the odd mode characteristic impedance $Z_{0,o}$ ($Z_{0,e} > R_0 > Z_{0,o}$). The propagation constants for the even and odd modes are given by $$\beta_e = \frac{2\pi}{\lambda_0} \sqrt{\varepsilon_{\it{eff},e}} \quad (13)$$

$$\beta_o = \frac{2\pi}{\lambda_0}\sqrt{\varepsilon_{\mathit{eff},o}} \tag{14}$$

where $\lambda_0$ is the free space wavelength and $\in_{\mathit{eff},e}$ and $\in_{\mathit{eff},o}$ are the relative effective dielectric constants of the even and odd mode propagation, respectively. The effective relative dielectric constants vary between the dielectric constants of air ($\in_0$) and the substrate ($\in_1$). Since the even mode propagates between the microstrip line and the ground, the relative effective dielectric constant for even mode will be larger than that of the odd mode. The odd mode will propagate between the two microstrip conductors.

Equation 15 states the relation of various dielectric constants $$\in_0 < \in_{\mathit{eff},o} < \in_{\mathit{eff},e} < \in_1 \tag{15}$$

An implication of Equation 15 is that even mode propagates slower than the odd mode ($\beta_e > \beta_o$).

For example we will consider an example of a MCL circuit, which in no way restricts the scope of the invention and we will obtain the output zero-frequency monopulse using the simple transmission line theory and also using Agilent ADS software.

As MCL, a thickness of h=1.55 mm and $\in_r$=4.6 (FR4 substrate) can be chosen. The width of the microstrip transmission lines are w=2.54 mm and the separation between these lines is chosen as S=0.508 mm. Using these parameters, ADS line calculator tool, the following characteristic impedances are easily obtained;

$R_0$=51.8Ω

$Z_{0,e}$=69.36Ω

$Z_{0,o}$=38.713Ω  (16)

The even mode impedance is the largest impedance. The relative effective dielectric constants are calculated as $\in_{\mathit{eff},o}$=3.124<4.6

$\in_{\mathit{eff},e}$=4.026<4.6  (17)

It is clear from these results that the odd mode moves faster and that its characteristic impedance is smaller than that of the even mode.

Figure 5:
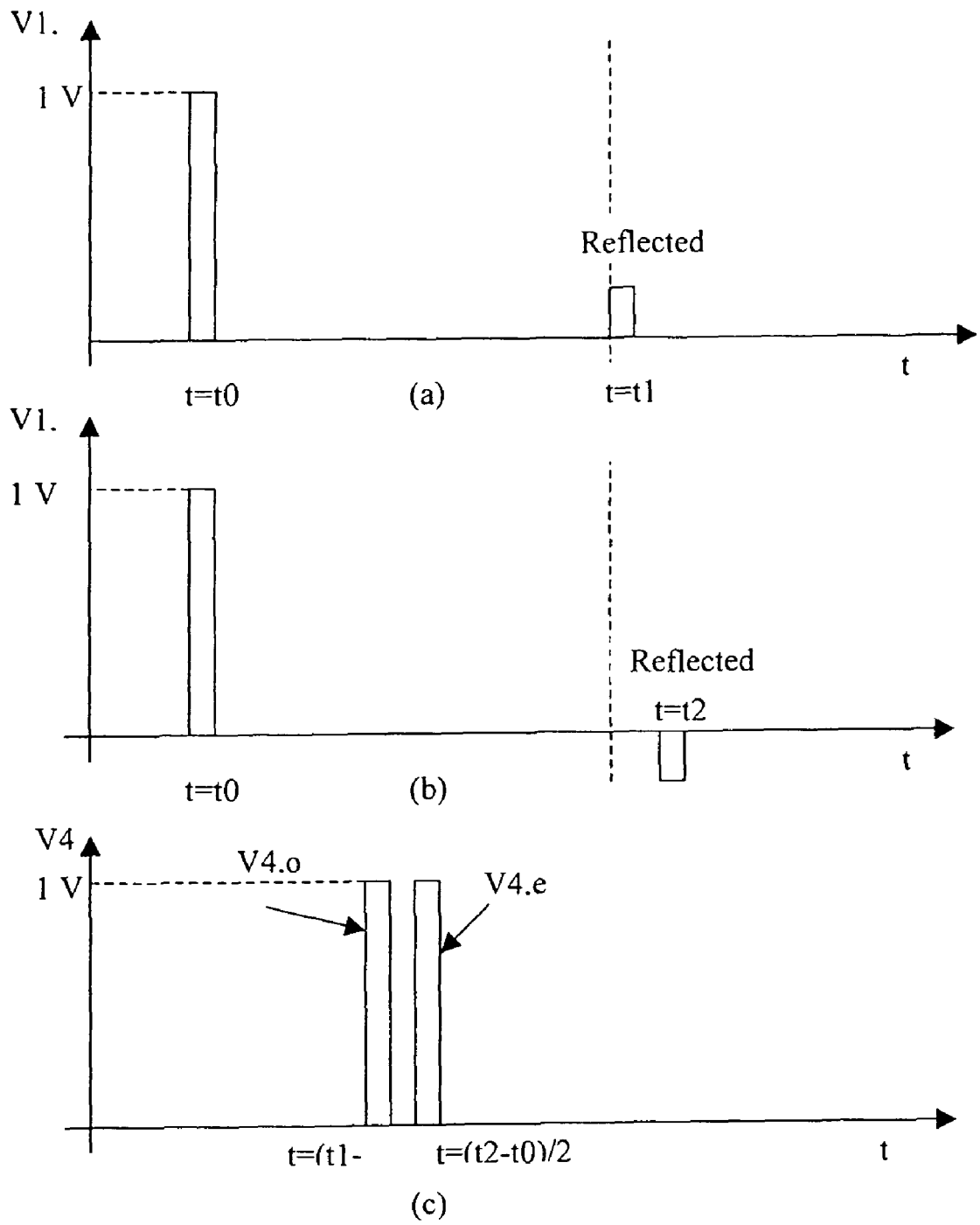
FIGS. 5a, 5b and 5c show the port1 and port4 pulse voltages for even and odd modes.

FIGS. 5a, 5b and 5c show the port1 and port2 voltages for even and odd modes. Using the circuits in FIGS. 3b and 3c, and Equations 1, 2, 9 and 10, we can calculate the voltage waveforms at four ports. If we apply the voltage from the port1 and terminate all other ports with matched load, we can solve the circuits with their characteristic impedances and propagation constants to obtain the other port voltages. For the odd mode circuit, $R_0$ is greater than $Z_{0,o}$, therefore, a positive reflection will occur from both the load and the generator side. This voltage reflection coefficient for both end of the transmission line will be given by $$\Gamma_o = \frac{R_0 - Z_{0,o}}{R_0 + Z_{0,o}} > 0 \tag{18}$$

If a pulse is sent at time t=$t_0$ seconds, the first reflection will arrive at port1 at time t=$t_1$ seconds with smaller amplitude as shown in FIG. 5a. For the even mode circuit, $R_0$ is smaller than $Z_{0,e}$, and hence, a negative reflection will be from both the load and the generator side. The voltage reflection coefficient for both end of the transmission line will be given by $$\Gamma_e = \frac{R_0 - Z_{0,e}}{R_0 + Z_{0,e}} < 0 \tag{19}$$

If the pulse is sent at time t=$t_0$ seconds, the first reflection will reach the port1 at time t=$t_2$ seconds with also smaller amplitude as shown in FIG. 5b. If the transmission line is assumed to be non-dispersive, then, odd and even mode voltages for port4 will be the time delayed versions of corresponding port1 voltages. Further, they would be delayed according to their phase velocity on the transmission line. Odd voltage pulse will arrive earlier as shown in FIG. 5c, since it travels faster. We can obtain the voltages at ports 2 and 3 by using these 4 even and odd voltages and Equations 9 and 10.

Figure 6:
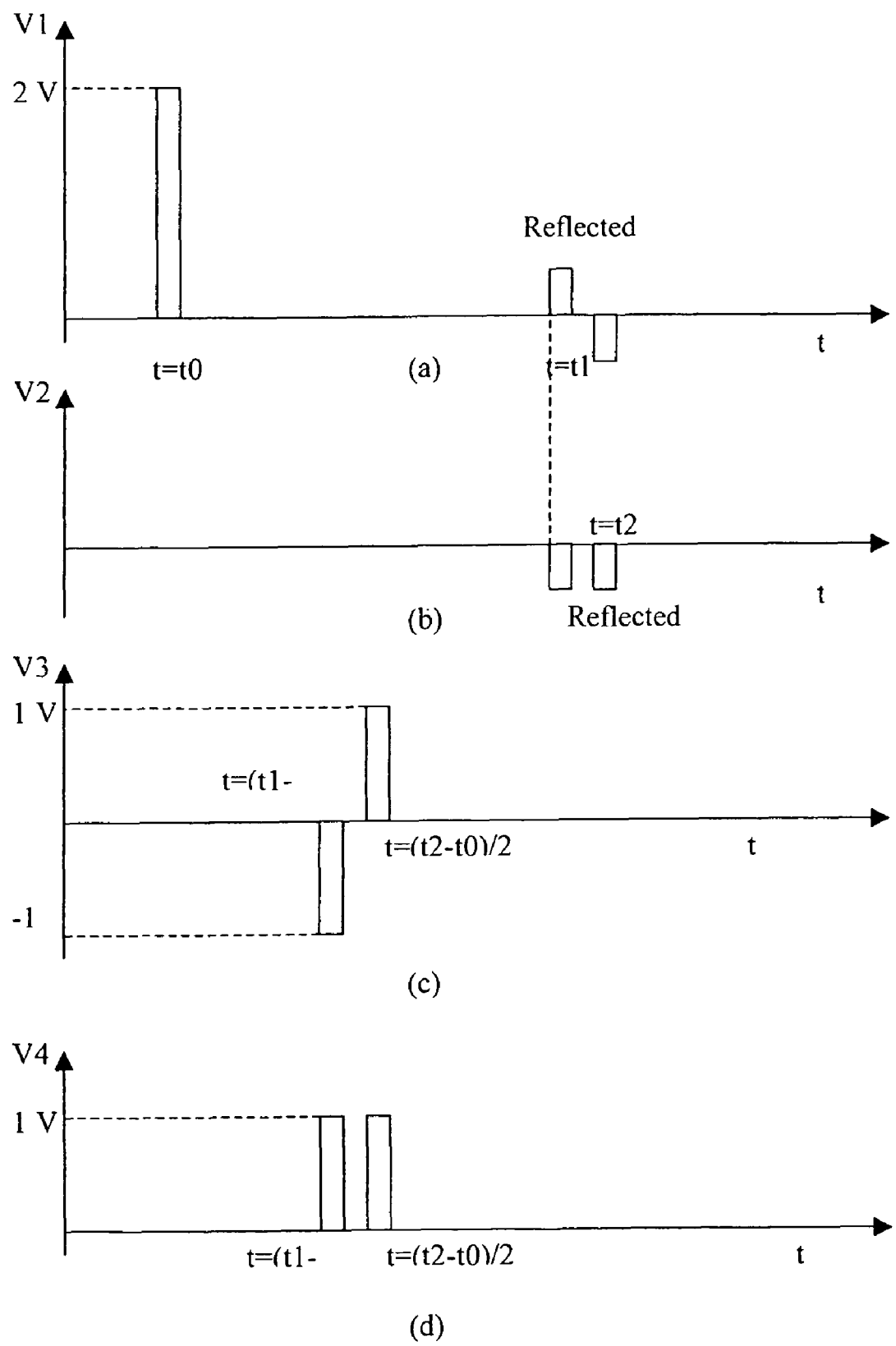
FIGS. 6a, 6b and 6c show the port voltages for port1, port2, port3 and port4, respectively.

FIGS. 6a, 6b, 6c and 6d show the port voltages for port1 (8), port2 (9), port3 (10) and port4 (11) respectively. From the point of UWB communication, the output of interest is the monopulse from port3, which has a zero frequency component. The initial pulse is applied from port1 as a 2 Volts amplitude pulse, and the reflected pulses arrive at t=$t_1$ and t=$t_2$ seconds with much smaller amplitudes as shown in FIG. 6a. The port2 only have reflections at t=$t_1$ and t=$t_2$ seconds as shown in FIG. 6b.

FIG. 6c is the plot of the monopulse output from the MCL port3. For this port, two pulses with opposite polarities arrive at different times, these pulses are exact copies of the input pulse. It is the definition of derivative such that if you take one waveform and its delayed version and subtract from each other, the derivative of the waveform is obtained. Basically, this circuit does exactly that. The relative arrival time of these two pulses can be adjusted by changing the transmission line length or the dielectric constant of the substrate material. Finally, the voltage at port4 is a two pulse waveform with the same polarities. For all 4-port voltages, there will be no more reflections even if the time axis is extended since each port is terminated with a matched load.

Figure 7:
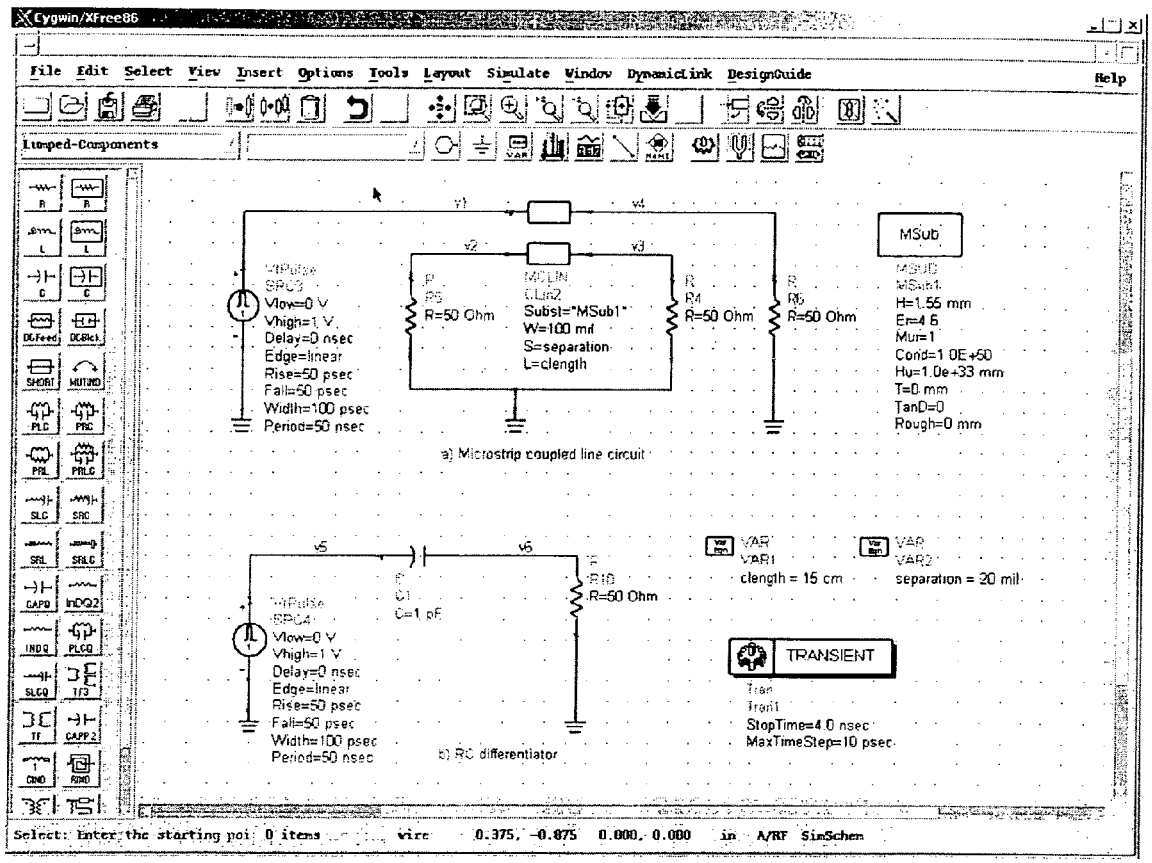
FIG. 7a shows a microstrip coupled line circuit according to the present invention on Agilent ADS design software.
FIG. 7b shows a RC circuit according to the prior art UWB waveform generator on Agilent ADS design software.

FIG. 7 show two schematics on Agilent ADS design software. One of the schematics is that the MCL circuit connected to a pulse generator with all ports matched with 50 Ohms that is shown in FIG. 7a. Second, the simple RC circuit according to the prior art UWB waveform generator according to J. Han et al. with C=1 pF and R=50 Ohms is shown in FIG. 7b. Both circuits are connected to a pulse generating circuit which outputs a 1-V pulse with 50 psec rise and fall times and a width of 100 psec, total pulse duration is set to 200 psec. The MCL circuit is designed such that a 300 psec pulse will be the output from port 3 of the circuit.

The length of the microstrip transmission lines (2,3) can be set according to the desired pulse width of the waveform. By adjusting the transmission line length, the desired pulse shape could be obtained. To obtain the desired monopulse with no zero-frequency component, pulse width and the transmission line length should be both taken into consideration as design parameters. Basically, the odd mode and even mode propagate at different velocities, and this difference in velocities will create the time difference between the even and odd mode pulses at a specific point on the transmission line. So, for the desired pulse, the transmission line length should be a design parameter as well as the time duration of the pulse. To obtain a monopulse, the difference between time delays ($t_2 - t_1$) should be equal to the pulse width $\Delta t$. This is given by $$t_2 - t_1 = \Delta t \tag{20}$$

Assume that the length of the transmission line is l, then, the time duration that it takes for the odd and even mode voltages to reach port 3 will be given by, $$t_2 - t_0 = \frac{l}{v_e} \tag{21}$$

$$t_1 - t_0 = \frac{l}{v_o} \tag{22}$$

where $v_e = c/\sqrt{\varepsilon_{eff,e}}$ and $v_o = c/\sqrt{\varepsilon_{eff,o}}$ are the velocities of the even and odd modes. Using Equations 20-22, we can obtain the transmission line length versus pulse width relation as, $$l = \Delta t \times c \frac{1}{\sqrt{\varepsilon_{eff,e}} - \sqrt{\varepsilon_{eff,o}}} \tag{23}$$

As an example, for the same FR4 substrate of $\varepsilon_r = 4.6$, the calculated values of effective dielectric constants for the odd and even modes are given in Equation 17, and if the desired pulse width is taken as 200 picoseconds, then, the transmission line length is calculated as 25.1 cm using Equation 23. Note that for a higher dielectric constant material and by using meander trace line, the area of the transmission line circuit could be made a few square-cm.

Figure 8:
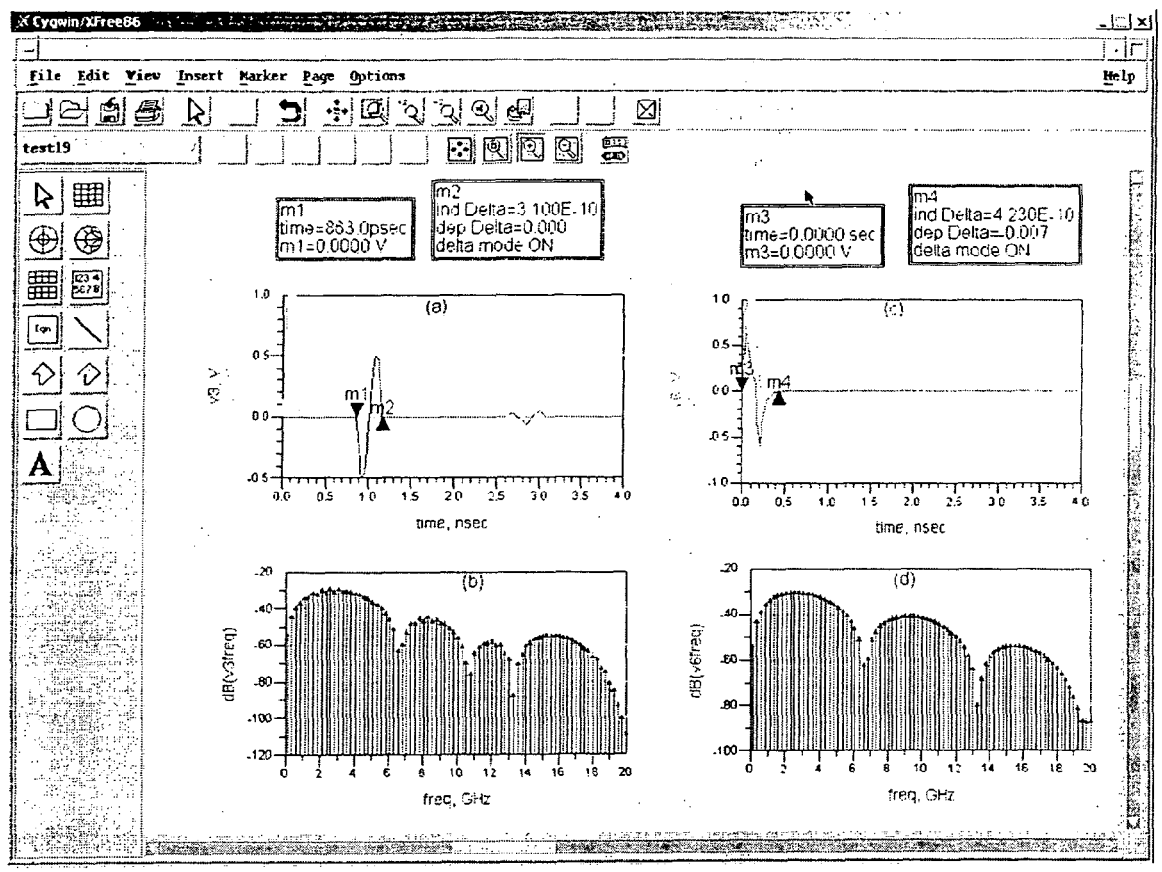
FIGS. 8a and 8b show the time domain waveform and the frequency response of the port3 voltage for a microstrip coupled line circuit according to the present invention.
FIGS. 8c and 8d show the time domain waveform and the frequency response of the port3 voltage for a RC circuit according to the prior art UWB waveform generator.

FIG. 8 is the plot of the zero-frequency outputs of the differentiator circuit. FIG. 8a and 8b show the time domain waveform and the frequency response of the port3 voltage for a microstrip coupled line circuit according to the present invention. FIG. 8c and 8d show the time domain waveform and the frequency response of the port3 voltage for a RC circuit according to the prior art UWB waveform generator. It can be seen that the pulse V3 obtained from the MCL circuit according to the present invention is well shaped and smooth, its amplitude changes between ±0.5 V, and the second order reflections are very small. Pulse envelope smoothness is important since it will determine the spurious response in the frequency domain such as sidelobe levels. To obtain a comparable solution, 1 pF capacitance is used in RC circuit, but, in practice, it is a very small capacitance (almost parasitic capacitances in most applications) to work with. As it can be seen from FIG. 8c, the amplitude of waveform V6 changes between around ±0.6 Volts, however, the waveform has very abrupt changes at its peaks, and this will increase the out of band spurious radiation. RC circuit generated pulse could be made more smooth by decreasing the capacitance values, however, this is first not that feasible since the capacitance level is already at parasitic capacitances level in a typical circuit, and also, decreasing the capacitance will also decrease the output voltage level and hence the power level.

In the prior art UWB waveform generator disclosed by J. Han et al. mentioned above, the peak voltage started as 7 Volts, and at the end of the diode, the output was measured as 1 volts. If MCL is used to obtain the monopulse voltage, the voltage drop between input and output is almost close to ideal case. We have only 3 dB loss from the generator, and this is maximum that can be drawn from the generator.

In the ultra wideband waveform generator circuit according to the present invention, we do have smaller second order reflections and said matched loads $R_1$ (4), $R_2$ (5), $R_3$ (6), $R_4$ (7) terminating the corresponding ports (8, 9, 10, 11) reduces to zero the second order reflections of the waveform generator circuit (1) according to the present invention. This is very important if the circuit is to be used in a receiver for determining a radar return typically a small amplitude signal. If the second order reflections of the circuitry are small, then the signal sensitivity of the circuit will increase, and be able to detect smaller amplitude signals. It will also result in higher signal to interference level, and smaller distortion. Therefore, the microstrip coupled line, ultra wideband waveform generator circuit according to the present invention can be advantageously used in radars, preferably in ground penetrating radars.

The microstrip coupled line, ultra wideband waveform generator circuit of the present invention can also be used in UWB communication transmitter and receiver circuits, wireless personal area networks (WPAN).

According to another embodiment of the present invention, said microstrip coupled line, ultra wideband waveform generator circuit can be used as an input by another circuit. In that case, the load impedance will change the voltage waveform of the RC circuit output. However, connecting a load to MCL has already been done by terminating the port3 by a matched load. In addition, the pulse width generated by the MCL is narrower than the RC circuit, which might be desirable for some applications.

According to still another embodiment of the present invention, the use of said microstrip coupled line UWB waveform generator circuit is not only limited to generate the two opposite polarity pulses given a single pulse as described so far. One of these single pulses can also be obtained by the exact MCL circuit. If a unit step pulse is applied as an input to port1, port3 output will be the monopulse waveform with narrow time duration. The unit step pulse could be easily obtained from a step recovery diode, or a tunnel diode circuit. Further, the same circuit can be used to obtain Gaussian doublets from Gaussian monopulse by adding the monopulse and its delayed replica with opposite polarity.

While the invention has been particularly shown and described with reference to preferred embodiments thereof, it will be understood by those skilled in the art that various other modifications and changes may be made to the present invention from the principles of the invention, described above without departing from the spirit and scope thereof.

The invention claimed is:

1. An UWB waveform generator circuit placed on a substrate, with transmission lines, loads, and ports, wherein the circuit takes as an input a waveform and generates as an output a derivative of said waveform, and wherein the circuit comprises two microstrip transmission lines that are coupled to form a microstrip coupled line (MCL).

2. An UWB waveform generator circuit according to claim 1, wherein the loads match with characteristic impedances of the microstrip coupled line (MCL).

3. An UWB waveform generator circuit according to claim 2, wherein said matched loads terminate corresponding ports.

4. An UWB waveform generator circuit according to claim 1, wherein said UWB waveform generator circuit generates the derivative of the waveform from even and odd mode propagations on the microstrip coupled line (MCL).

5. An UWB waveform generator circuit according to claim 1, wherein the length of the microstrip coupled line (MCL) can be set according to a desired pulse width of the waveform.

6. An UWB waveform generator circuit according to claim 1 for use in applications chosen from: UWB communication transmitter and receiver circuits, wireless personal area networks (WPAN), and radars.

7. An UWB waveform generator circuit according to claim 6, wherein its use in radar applications are in ground penetrating radars and Thru-Wall Imaging Radars.

8. An UWB waveform generator circuit according to claim 2, wherein said UWB waveform generator circuit generates the derivative of the waveform from the even and odd mode propagations on the microstrip coupled line (MCL).

9. An UWB waveform generator circuit according to claim 3, wherein said UWB waveform generator circuit generates the derivative of the waveform from even and odd mode propagations on the microstrip coupled line (MCL).

10. An UWB waveform generator circuit according to claim 2, wherein the length of the microstrip coupled line (MCL) can be set according to a desired pulse width of the waveform.

11. An UWB waveform generator circuit according to claim 3, wherein the length of the microstrip coupled line (MCL) can be set according to a desired pulse width of the waveform.

12. An UWB waveform generator circuit according to claim 4, wherein the length of the microstrip coupled line (MCL) can be set according to a desired pulse width of the waveform.

13. An UWB waveform generator circuit according to claim 8, wherein the length of the microstrip coupled line (MCL) can be set according to a desired pulse width of the waveform.

14. An UWB waveform generator circuit according to claim 9, wherein the length of the microstrip coupled line (MCL) can be set according to a desired pulse width of the waveform.

15. An UWB waveform generator circuit according to claim 2 for use in applications chosen from: UWB communication transmitter and receiver circuits, wireless personal area networks (WPAN), and radars.

16. An UWB waveform generator circuit according to claim 3 for use in applications chosen from: UWB communication transmitter and receiver circuits, wireless personal area networks (WPAN), and radars.

17. An UWB waveform generator circuit according to claim 4 for use in applications chosen from: UWB communication transmitter and receiver circuits, wireless personal area networks (WPAN), and radars.

18. An UWB waveform generator circuit according to claim 5 for use in applications chosen from: UWB communication transmitter and receiver circuits, wireless personal area networks (WPAN), and radars.

19. An UWB waveform generator circuit according to claim 8 for use in applications chosen from: UWB communication transmitter and receiver circuits, wireless personal area networks (WPAN), and radars.

20. An UWB waveform generator circuit according to claim 9 for use in applications chosen from: UWB communication transmitter and receiver circuits, wireless personal area networks (WPAN), and radars.

* * * * *